US012052832B2

(12) United States Patent
Avuthu et al.

(10) Patent No.: US 12,052,832 B2
(45) Date of Patent: Jul. 30, 2024

(54) PRINTING OF MULTILAYER CIRCUITS ON GRAPHICS

(71) Applicant: JABIL INC., St. Petersburg, FL (US)

(72) Inventors: Sai Guruva Reddy Avuthu, St. Petersburg, FL (US); Nabel Ghalib, St. Petersburg, FL (US); Mark Sussman, St. Petersburg, FL (US); Arnoldo Reta, St. Petersburg, FL (US); Samantha Stevens, St. Petersburg, FL (US); Nathaniel Richards, St. Petersburg, FL (US); MaryAlice Gill, St. Petersburg, FL (US); Girish Wable, St. Peterburg, FL (US); Ronald Darnell, St. Petersburg, FL (US); Ralph Hugeneck, St. Petersburg, FL (US); Jorg Richstein, St. Petersburg, FL (US)

(73) Assignee: JABIL INC.

( * ) Notice: Subject to any disclaimer, the term of this patent is extended or adjusted under 35 U.S.C. 154(b) by 607 days.

(21) Appl. No.: 17/288,870

(22) PCT Filed: Oct. 24, 2019

(86) PCT No.: PCT/US2019/057887
§ 371 (c)(1),
(2) Date: Apr. 26, 2021

(87) PCT Pub. No.: WO2020/086863
PCT Pub. Date: Apr. 30, 2020

(65) Prior Publication Data
US 2022/0007520 A1 Jan. 6, 2022

Related U.S. Application Data

(60) Provisional application No. 62/750,702, filed on Oct. 25, 2018.

(51) Int. Cl.
H05K 1/02 (2006.01)
G06F 3/044 (2006.01)
(Continued)

(52) U.S. Cl.
CPC ......... *H05K 3/4664* (2013.01); *G06F 3/0444* (2019.05); *G06F 3/0488* (2013.01);
(Continued)

(58) Field of Classification Search
CPC .. H05K 1/02; H05K 3/00; H05K 3/12; H05K 3/46
See application file for complete search history.

(56) References Cited

U.S. PATENT DOCUMENTS

2004/0177777 A1 9/2004 Michiels
2006/0159899 A1 7/2006 Edwards et al.
(Continued)

FOREIGN PATENT DOCUMENTS

CN 102892253 1/2013
CN 102892253 B 12/2015
(Continued)

OTHER PUBLICATIONS

International Search Report and Written Opinion issued on Apr. 30, 2020 in PCT/US2019/057887.
(Continued)

Primary Examiner — Jeremy C Norris
(74) Attorney, Agent, or Firm — Riverside Law LLP

(57) ABSTRACT

The disclosure is and includes at least an apparatus, system and method printing multilayer circuits on graphics. The multilayer print may include forming an electronic human machine interface, sensor readout, or a driver circuit, by way of example, and may include successively printing at least two functional ink layers comprising at least one conductive layer and at least one dielectric layer on a substrate com-
(Continued)

prising one of a thermoform and an overmold; printing at least one non-conductive graphical ink layer in the succession of the successively printing; curing each of the successively printed layers after the printing of each of the successively printed layers, wherein the curing of the successively printed functional ink layers comprises at least an ultra-violet curing; and squeegeeing at least the at least one conductive layer with a squeegee having a low durometer.

20 Claims, 6 Drawing Sheets

(51) Int. Cl.
G06F 3/0488 (2022.01)
H05K 3/12 (2006.01)
H05K 3/46 (2006.01)

(52) U.S. Cl.
CPC .............. *H05K 1/02* (2013.01); *H05K 3/1233* (2013.01); *H05K 3/1283* (2013.01)

(56) References Cited

U.S. PATENT DOCUMENTS

| | | |
|---|---|---|
| 2013/0278545 A1 | 10/2013 | Cok et al. |
| 2016/0242296 A1 | 8/2016 | DeAngelis |
| 2016/0345437 A1 | 11/2016 | Heikkinen |
| 2018/0114703 A1 | 4/2018 | Karni et al. |

FOREIGN PATENT DOCUMENTS

| | | |
|---|---|---|
| EP | 0059206 | 9/1982 |
| WO | 0184896 | 11/2001 |

OTHER PUBLICATIONS

International Preliminary Report on Patentability, dated Apr. 27, 2021 in PCT/US2019/057887.

PRINTING OF MULTILAYER CIRCUITS ON GRAPHICS

CROSS-REFERENCE TO RELATED APPLICATIONS

This application is a national stage application of International Patent Application No. PCT/US2019/057887, filed Oct. 24, 2019, entitled: Printing of Multilayer Circuits on Graphics, which claims the benefit of priority to U.S. Provisional Application No. 62/750,702, filed Oct. 25, 2018, entitled: Printing of Multilayer Circuits on Graphics, the entireties of which is incorporated herein by reference as if set forth in its entireties.

BACKGROUND

Field of the Disclosure

The disclosure relates generally to additive manufacturing printing and, more particularly, to an apparatus, system and method for printing multilayer circuits on graphics.

Background of the Disclosure

In the known art of human machine interfaces (HMIs), sensor readouts, and driver circuits, circuits are typically fabricated using flexible printed circuit board (PCB) technologies. When the need for graphics arises, such as for a HMI for an appliance, active conductive circuits are typically bonded or glued to the graphics as needed. This is due, in large measure, to the fact that only such bonding or gluing embodiments are suitable to withstand the issues that arise in the complex manufacturing processes for a HMI, such as the thermoforming or overmolding typically employed to create a HMI. Unfortunately, the expense and complexity of manufacturing using glue and bonding, and the separate creation of active circuits, such as on flexible or inflexible printed circuit boards (PCBs), limits the available complexity and performance of the circuits currently used in typical HMIs.

Further, the complexity of these bonding, gluing, and/or PCB based embodiments requires the use of numerous different types of equipment during the manufacturing process in order to create the HMI. Consequently, the need exists for the ability to manufacture HMIs, sensor readouts, and driver circuits with a small and consistent set of equipment in multiple layers using additive processes, so as to allow for additional complexity in and improved performance of HMIs.

Therefore, the need exists for an apparatus, system and method of printing multilayer circuits on graphics.

SUMMARY

The disclosure is and includes at least an apparatus, system and method printing multilayer circuits on graphics. The multilayer print may include forming an electronic human machine interface, sensor readout, or a driver circuit, by way of example, and may include successively printing at least two functional ink layers comprising at least one conductive layer and at least one dielectric layer on a substrate comprising one of a thermoform and an overmold; printing at least one non-conductive graphical ink layer in the succession of the successively printing; curing each of the successively printed layers after the printing of each of the successively printed layers, wherein the curing of the successively printed functional ink layers comprises at least an ultra-violet curing; and squeegeeing at least the at least one conductive layer with a squeegee having a low durometer, such as a durometer of less than about 70.

The succession of successively printed functional ink layers may comprise a conductive layer, followed by two dielectric layers, followed by another conductive layer, followed by a dielectric layer. The embodiments may further include printing an encapsulation layer over a last of the successively printed layers. The graphical ink layer further may comprise non-carbon.

The disclosure may further include an apparatus, system and method of forming a human machine interface. The apparatus, system and method may include a thermoform substrate; a plurality of ultraviolet cured functional ink layers comprising at least a touch responsive circuit, a backlighting driver circuit suitable to light the touch responsive circuit, and a plurality of dielectric layers that impart functionality and protection to at least the touch responsive and backlighting driver circuit; and at least one graphical ink layer that associates graphics with the touch responsive circuit.

Thus, the disclosure provides an apparatus, system and method of printing multilayer circuits on graphics.

BRIEF DESCRIPTION OF THE DRAWINGS

The disclosure is illustrated by way of example and not limitation in the accompanying drawings, in which like references indicate similar elements, and in which.

DETAILED DESCRIPTION

Figure 1:
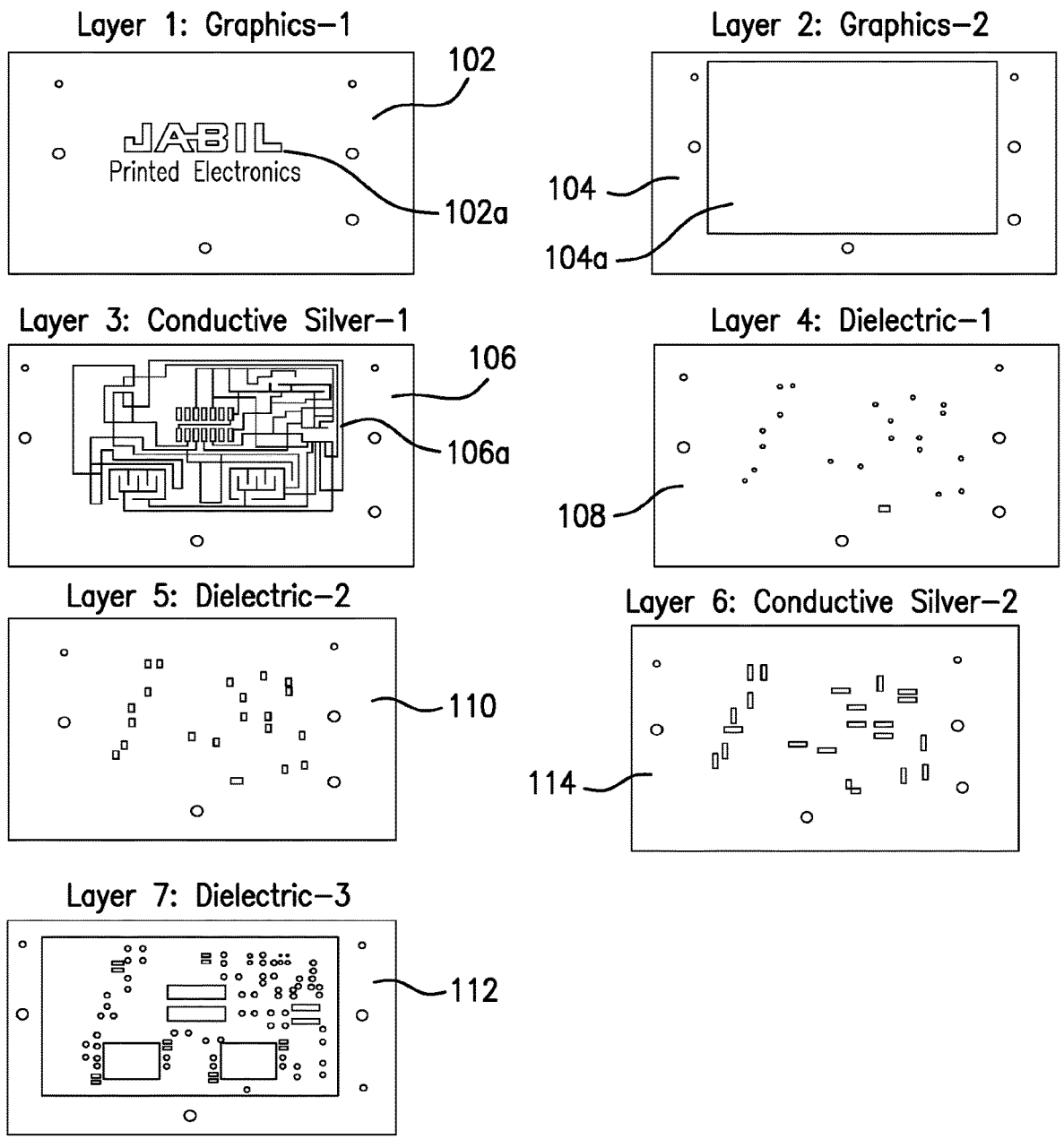
FIG. 1 illustrates a plurality of additively manufactured print layers.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the exemplary embodiments.

Computer-implemented platforms, engines, systems and methods of use are disclosed herein. Described embodiments of these platforms, engines, systems and methods are intended to be exemplary and not limiting. As such, it is contemplated that the herein described systems and methods may be adapted to provide many types interactions, data exchanges, and the like, and may be extended to provide enhancements and/or additions to the exemplary platforms, engines, systems and methods described. The disclosure is thus intended to include all such extensions.

Furthermore, it will be understood that the terms "module" or "engine", as used herein does not limit the functionality to particular physical modules, but may include any number of tangibly-embodied software and/or hardware components having a transformative effect on at least a portion of a system. In general, a computer program product in accordance with one embodiment comprises a tangible computer usable medium (e.g., standard RAM, an optical disc, a USB drive, or the like) having computer-readable program code embodied therein, wherein the computer-readable program code is adapted to be executed by a processor (working in connection with an operating system) to implement one or more functions and methods as described below. In this regard, the program code may be implemented in any desired language, and may be implemented as machine code, assembly code, byte code, interpretable source code or the like (e.g., via C, C++, C#, Java, Actionscript, Objective-C, Javascript, CSS, XML, etc.).

In order to address difficulties in thermoforming and overmolding, such as for use in consoles for human machine interfaces (HMI), such as for appliances like washing machines, the embodiments provide matched ink sets and improved 3D printing processes for a multi-layer print that include graphical and functional ink layers. That is, the ink sets and improved print processes provided allow for the use of in-print labeling, such as for the aforementioned that HMI. Further, as used herein throughout, the terms "print", "printing", "prints", "printings" or the like may indicate any known types of printing methodologies, although certain of the embodiments may particularly use additive printing methodologies, such as screen printing methodologies. The printing type used in embodiments may vary based on the substrate on which printing occurs (such as a thermoform versus an overmold versus a thin- or thick-film substrate which is later added over a thermoform or an overmold), based on the ultimate environment of use for the print, and/or may vary layer by layer in a given print.

As used herein, thermoforming is a manufacturing process in which a thermoplastic sheet is heated to a pliable forming temperature. The thermoform is then formed to a specific shape, and is molded and/or trimmed as needed to create a usable product. Historically, it is very difficult to print on a thermoform, either before thermoforming or after, due to the processing needed for the thermoform to fit into a product, such as an appliance's HMI. If an additive manufacturing print is made on the thermoform before the application of heat thereto, the additive print would generally suffer breakdown due to the heat; and if the print was made after thermoforming, the exposure of the print to the remainder of the manufacturing process and fitting of the thermoform would generally cause a breakdown of the additive print. This breakdown of an additive print in a thermoforming context is exacerbated in the known art where the additive print includes multiple print layers comprised of both functional and graphical ink layers.

Overmolding is an injection molding process that provides significant product resilience and improved product appearance. As such, it has historically been regularly used in manufacturing where the final product, such as the finished appliance with a HMI, uses complex final molded component designs. In a typical overmolding process, a pre-mold is insert molded out of one material and then transferred to a second mold. The molding over the insert becomes integral to the master part on cooling. In short, in overmolding, a new plastic layer is formed around a first molded part. As was the case above with thermoforming, the processes needed to form an overmolded HMI have historically caused breakdowns in any efforts to use additive manufacturing in an overmolded HMI, particularly if the additive print comprised both functional and graphical ink layers.

As the phrase is used herein, a human machine interface (HMI) includes the electronics required to signal and control the state of equipment and machines, wherein the control signals are generated based on human interaction with the HMI. By way of non-limiting example, HMIs can range from basic LED status indicators, to backlit manual buttons, to large HMI panels with responsive backlighting and capacitive or similar touchscreen interfaces. HMI applications require mechanical robustness and resistance to water, dust, moisture, a wide range of temperatures, and, in some environments, should provide communication and/or secure network communication.

In short, a thermoformed or overmolded HMI may necessitate the use of both graphic inks and functional inks. By way of non-limiting example, an HMI may have two graphical ink layers and at least three, such as five, functional ink layers. Correspondingly, the ink characteristics and substrate characteristics, as between the various functional and non-functional layers must comprise a matched ink set in order to provide optimal operability of the HMI, and further to ensure long life of the HMI.

FIG. 1 illustrates an exemplary 7 layer ink-set embodiment, and combines functional and graphical ink sets in a uniform print. As illustrated, Layers 1 and 2 102, 104 may comprise graphic inks 102a, 104a, Layer 3 106 may provide a conductive circuit 106a, such as a capacitive touch circuit that allows for human interaction with an HMI partially formed by the print. Layers 4 and 5 108, 110 may comprise dielectric layers, as may Layer 7 112. Layer 6 114 may also provide a conductive layer that allows for additional electron conduction to provide for particular active HMI aspects of an exemplary embodiment.

Of significant note, layer 1 102 may, in embodiments, be a graphical ink layer that forms or forms upon a substrate for the remainder of the multilayer print. Thereafter, the substrate may be affixed to, for example, an overmold or a thermoform, such as via an adhesive. Alternatively, layer 1 102 may form a base print layer that is printed directly upon a receiving substrate, such as a receiving overmold or thermoform.

Figure 2A:
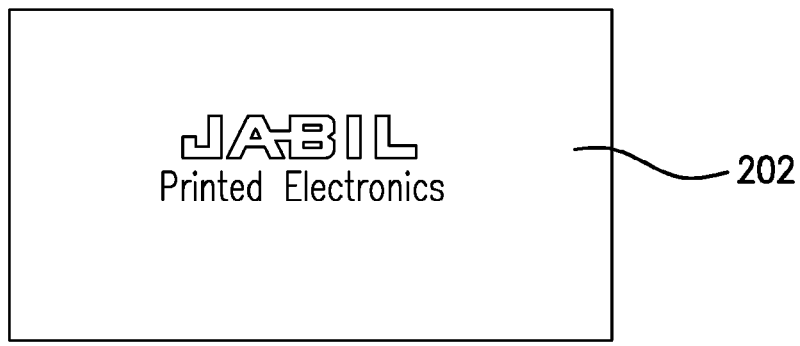
FIGS. 2A-2C illustrate an exemplary multilayer print embodiment for a human machine interface.
Figure 2B:
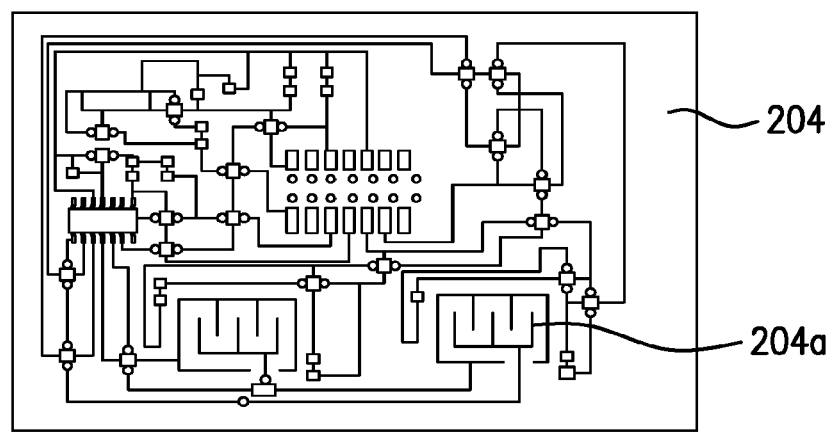

FIG. 2 illustrate with greater particularity three ink layer prints for use in an HMI device. As shown, and as was the case in the illustration of FIG. 1, Layer 1 202 comprises a graphical ink print. The graphical ink layer(s) employed herein may be non-conductive, i.e., non-carbon-based, inks, for the reasons discussed throughout, by way of non-limiting example. In the illustration, an additional layer, namely Layer 2 204, comprises a functional ink layer of a capacitive touch circuit 204a suitable for also providing LED back lighting. Functional conductive ink layers, as discussed herein, may be printed using silver conductive inks, such as those offered by Henkel, by way of non-limiting example. Functional dielectric ink layers, as discussed throughout, may be provided by DuPont, such as, for example, DuPont's ME773 and/or ME775 dielectric inks, by way of non-limiting example.

Figure 2C:
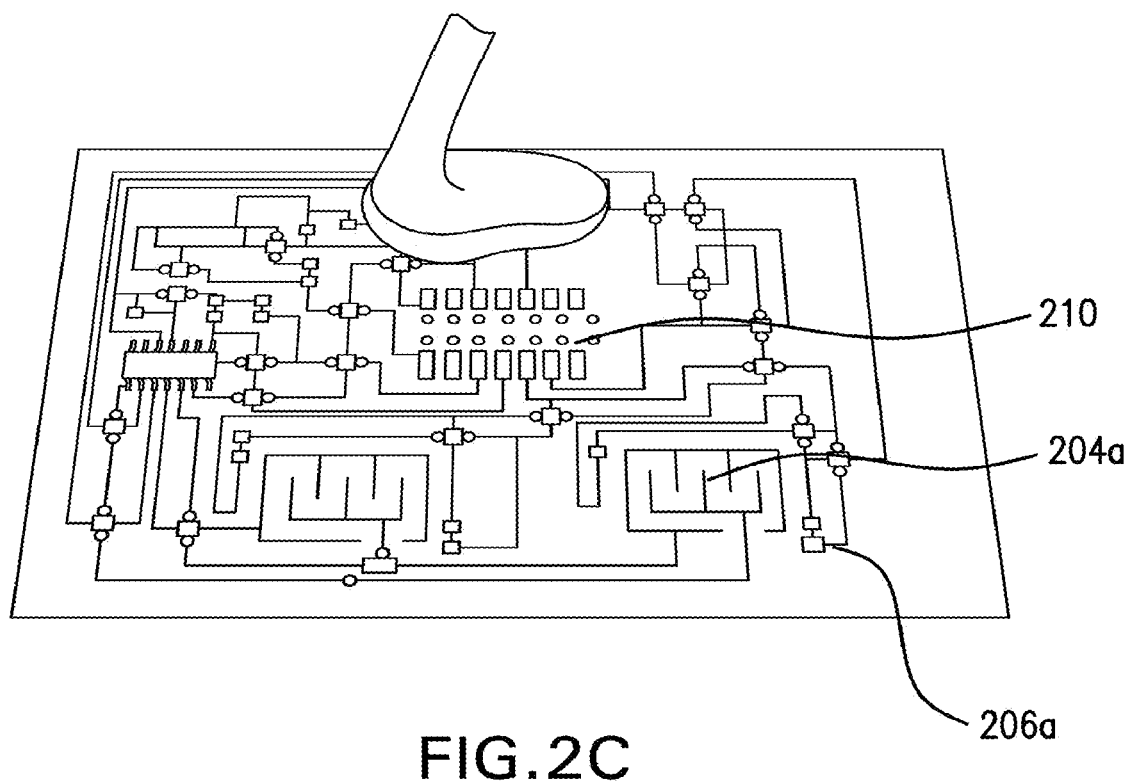

The capacitive touch circuit 204a in illustrative embodiments may include LED driver capability for the LED backlighting 206a for a capacitive touch screen, as shown in FIG. 2C. That is, in the illustration of FIG. 2C, LEDs 206a are used to light capacitive touch buttons in an HMI. Needless to say, in embodiments such as that illustrated in FIG. 2, a micro-controller 210 may be employed in order to provide LED operation as well as receipt of capacitive touch data. By way of example, an exemplary microcontroller may be at Atmel SAM D10 Smart ARM-based microcontroller.

The conductive layer shown may, needless to say, comprise printed functional inks of a conductive nature, such as Henkel Ablestik 2030SC. The LED driving capability may be provided by any means known to those skilled in the art, such as use of a Panasonic DMC26404 driver. Moreover, the conductive layer shown, at least in order to provide LED operation and data exchange, may be connected to a power supply. Power may be provided by the device/machine, such as an appliance, to which the HMI interfaces, by way of non-limiting example. For example, 5 V of power may be connectively supplied to the circuit(s) shown in FIGS. 2B and 2C, which may be transformed by an appliance to which the HMI is connected from a 120V or 220V utility power supply.

Yet more particularly, and by way of non-limiting example only, Tables 1-5, below, illustrate exemplary inks, screens, substrate, printers, squeegees, and so on, to allow for production of the HMI illustrated in FIGS. 1 and/or 2. More specifically although ink curing in the examples of Tables 1-5 may be performed by oven-based heating, in exemplary embodiments, one or more layers may be cured using ultraviolet curing of inks, rather than oven-based curing.

TABLE 1

| | Ink | | |
|---|---|---|---|
| Function | Name | Batch | Expiration |
| Graphics | Proell Noriphan White HF | 162698 | April 2017 |
| Graphics | Proell Noriphan White HF | 164414 | April 2018 |
| Graphics | Proell Noriphan N2K 952 | 169664 | December 2017 |
| Graphics | Nazdar 8450 Barrier White | 1702100091 | July 2021 |
| Graphics | Nazdar Non-conductive Black | 65126664 | July 2021 |
| Catalyst | Nazdar NB72 | 0317060 | N/A |
| Conductive | Dupont ME 603 | 8MM005 | September 2017 |
| Dielectric | Dupont ME 775 | AUM018D15466605 | August 2017 |
| Dielectric | Dupont PE773 | ZJW019D15466553 | July 2016 |

TABLE 2

| | Screens | | Mesh Thread Count | |
|---|---|---|---|---|
| Function | MSN (Manufacture Serial Number) | Screen Material | (thread per in.)/Thread Thickness (microns) | Mesh Angle (Degrees) |
| Graphics 1 | 20170616-02 | Polyester | 255/24.0 | 22.5 |
| Graphics 2 | 20170616-01 | Polyester | 255/22.6 | 22.5 |
| Silver 1 | 20170616-03 | Stainless Steel | 325/28.4 | 22.5 |
| Dielectric 1 | 20170214-04 | Polyester | 280/22.2 | 22.5 |
| Dielectric 2 | 20170214-05 | Polyester | 280/22.2 | 22.5 |
| Silver 2 | 20170616-04 | Stainless Steel | 325/24.7 | 22.5 |
| Dielectric 3 | 20170214-03 | Polyester | 280/22.2 | 22.5 |

TABLE 3

| Substrate | | |
|---|---|---|
| Type | Thickness | Identifier |
| PC | 10 mil (250 μm) | SR906 |

TABLE 4

| Printers | | |
|---|---|---|
| Name | Serial Number | JobII Number |
| DEK | 311592 | 0113-00442 |
| MPM | GOSAMT00257 | 0319 |

TABLE 5

| Squeegees | |
|---|---|
| Printer | Identifier |
| DEK | JTS4044 (Bonded 75 durometer) |
| MPM | Blue (80 durometer) |
| MPM | Brown (60 durometer) |

The use of ultraviolet curing in certain of the embodiments may provide various advantages over the known art. For example, ultraviolet curing limits or eliminates the presence of pinholes in a printed ink layer, at least because inks tend to collapse, thereby shrinking portions of the ink layer, in oven/heat-curing embodiments. This layer collapse may cause pinholes to form in areas of the print trace that are thinner than other areas. On the other hand, because light-based curing comprises cross linking rather than heating, printed layers cured using light do not collapse in any part, thereby substantially eliminating pin holing. Of course, the skilled artisan will appreciate that pin holing may be addressed using other methodologies in one or more layers of the embodiments, such as to the extent oven/heat-curing is used in any of those other layers. For example, printed ink layers may be increased in thickness, or redundant prints may occur on any given print layer, in order to allow for heat curing and layer shrinkage without significant pinholing.

Figure 3A:
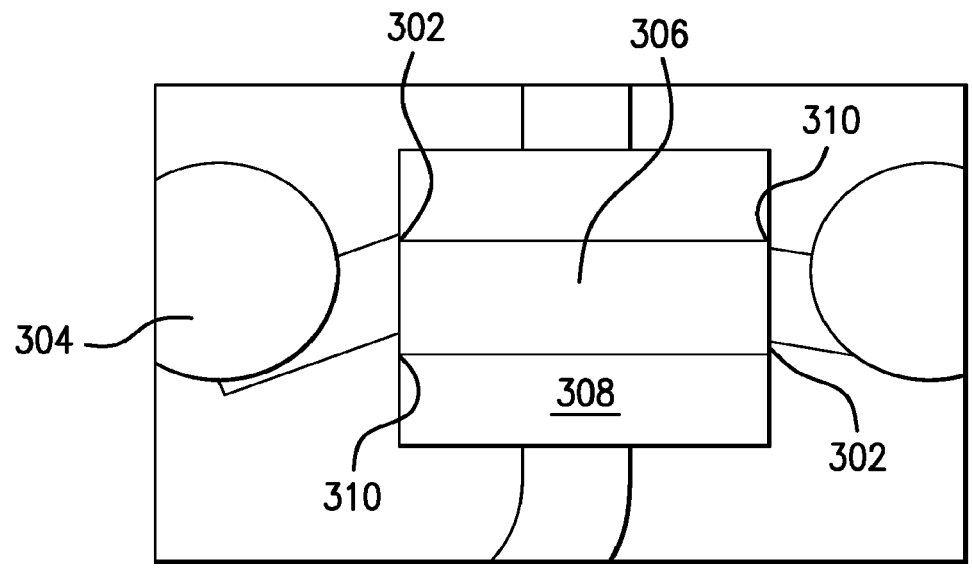
FIGS. 3A and 3B illustrate a broken and an unbroken multilayer printed circuit, respectively.

As illustrated in FIG. 3, additional issues may arise with multilayer prints, such as are provided in the embodiments, without the remedial features provided in the embodiments. By way of non-limiting example, FIG. 3A illustrates a broken circuit 302 as between a first conductive layer trace 304 and a second conductive layer trace 306 in the same layer as the first trace 304, wherein the second trace 306 of the same conductive layer is printed over a dielectric layer portion 308 but the first trace 304 is not. In previously known embodiments, the varying step height 310 caused by the addition of a dielectric layer aspect 308 under the second conductive trace 306 often led to a break in the conductivity 302, such as when a squeegee was brushed over that printed conductive layer which included the first and second traces 304, 306. As will be understood to the skilled artisan, a squeegee is frequently employed in additive print processes in order to level printed layers to allow for subsequent printing, and/or to remove excess print material.

Figure 3B:
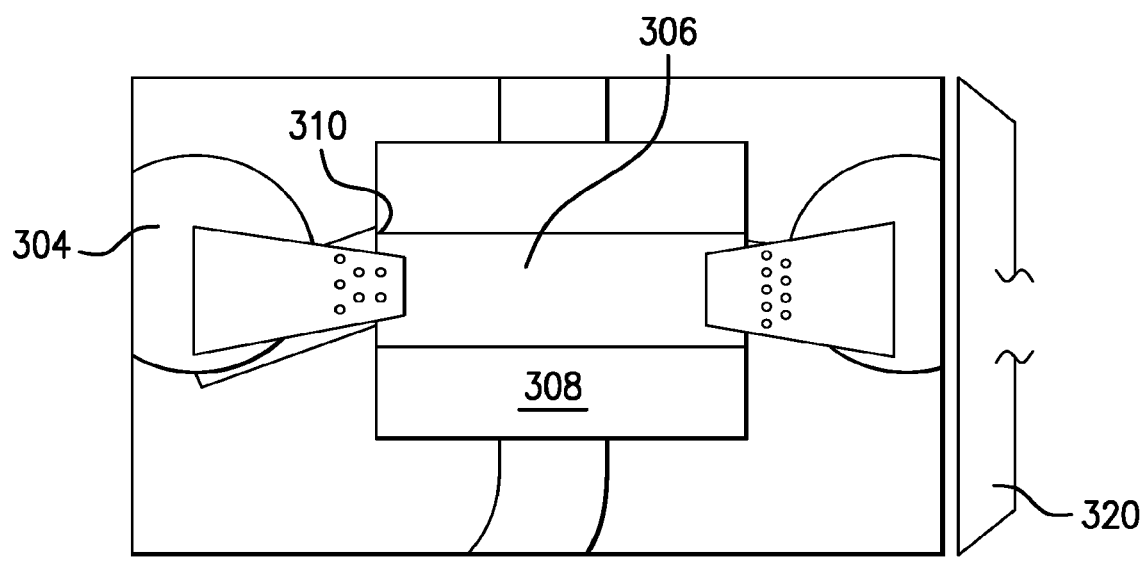

In the exemplary embodiments, it is consequently the case that lower durometer squeegees 320 are employed, as evidenced in FIG. 3B, to provide added "forgiveness" in brushing the squeegee over layers printed upon varying step heights. By way of non-limiting example, the disclosed embodiments may employ a squeegee 320 having a durometer in the range of 75 or less, such as a squeegee having a durometer of about 60. This additional forgiveness over the known art allows for the removal of less of the print thickness at a step height 310, thus negating the breaks in conductivity 302 that frequently appeared in the known art and as are illustrated in FIG. 3A.

Figure 4:
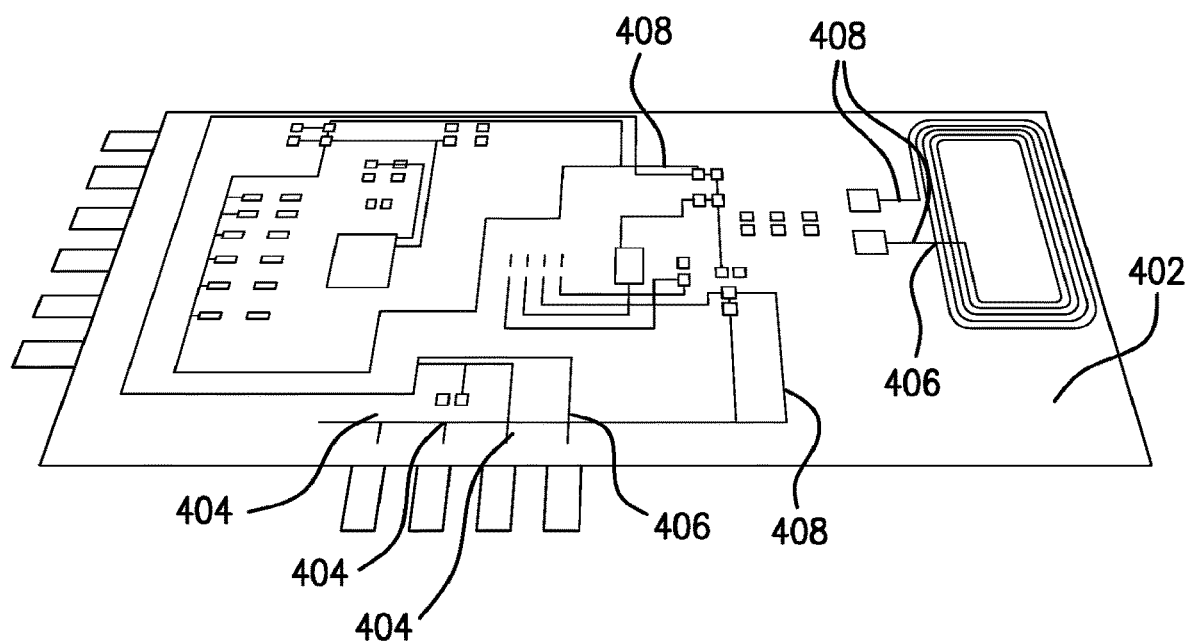
FIG. 4 illustrates stress points and an encapsulation layer in a multilayer print.

Yet further and as will be understood, encapsulation is frequently used in known multilayer print embodiments in order to secure components. However, in a manner similar to step heights (discussed above), encapsulation 402 may create one or more stress points 404 in printed layers. This creation of stress points 404 by encapsulation 402 is illustrated in FIG. 4. Accordingly, a dielectric layer 406 having inks "matched" to the conductive layer 408 may be over printed on the conductive layer, so that the subsequent encapsulant 402 doesn't touch the conductor and is thereby unable to stress the conductor at any of various stress points.

Of note, the over-printed dielectric layer 406 may cover only portions of the conductive layer 408 most likely to suffer stress points, may cover only the conductive trace portions of the conductive layer, or may cover the entire conductive layer. Thereby, a local or global dielectric protective layer, such as Layer 7 in FIG. 1, by way of non-limiting example, may be globally or locally used to protect the conductive layer from stress points caused by the encapsulation 402 illustrated in FIG. 4.

As mentioned above, a multilayer circuit having a matched ink set, such as is disclosed herein throughout, may, as will be understood to the skilled artisan, necessitate a cure for each successively printed ink level. Consequently, it is necessary that the curing of one ink layer not be additively detrimental to the performance of previously printed and cured ink layers. Thereby, and as referenced throughout, the embodiments may use ultraviolet, i.e., light based, curing methodologies for at least those layers immediately adjacent to the conductive layer, if not for all layers of the disclosed prints.

For example, and with reference again to FIG. 1, Table 6, below, illustrates the maintenance of substantially similar resistance in the conductive layer from the printing of the conductive layer through the printing of the first and second dielectric layers (such as Layers 4 and 5 of FIG. 1). This consistency in the resistance of the conductive layer (such as Layer 3 of FIG. 1) is indicative of the maintenance of performance of the conductive layer in spite of the multiple curings to which the conductive layer is subjected after curing of the conductive layer, i.e., the cures of the first and second dielectric layers. This maintenance of the performance of the conductive layer through multiple cures is, in part, due to the use of ultra-violet curing in the embodiments.

TABLE 6

| Test | Resistance (Ω) |
|---|---|
| One: Silver Only | 5.36 ± .653 |
| Two: After first dielectric | 5.05 ± .591 |
| Three: After second dielectric | 4.93 ± .545 |

Of course, additional considerations may be incorporated into the development of the matched ink set discussed herein. For example, it may be preferable that nonfunctional, i.e., graphical, ink layers be non-conductive and/or necessitate minimal curing. As such, non-carbon inks may be preferred for graphical layers, and/or ultra-violet curing may be used on such layers, as discussed throughout.

Further in relation to a matched ink set, the RMS (root mean square of surface heights) value, i.e., the roughness, of a graphical ink layer print should be less than the thickness of a conductive layer printed upon the graphical layer. That is, if the roughness of the graphical layer is too significant, the hills and valleys that result, upon printing of the conductive layer, may lead to breaks in conductivity of the conductive layer in a manner similar to the step height issues discussed above. In exemplary embodiments, a range for the thickness of the conductive layer may be at least 2-3 times greater than the roughness in the graphical layer. Of course, the skilled artisan may appreciate that other methodologies may be employed in order to "smooth" the roughness of the graphical layer print. For example, intervening dielectric layers may be provided having a particular thickness, solvency, or spread that will "absorb" the roughness of the graphical layer, such that, when the conductive layer is printed upon the intervening dielectric layer, the conductive layer is subjected to a relatively smooth printing substrate in the form of the intervening dielectric layer.

Figure 5:
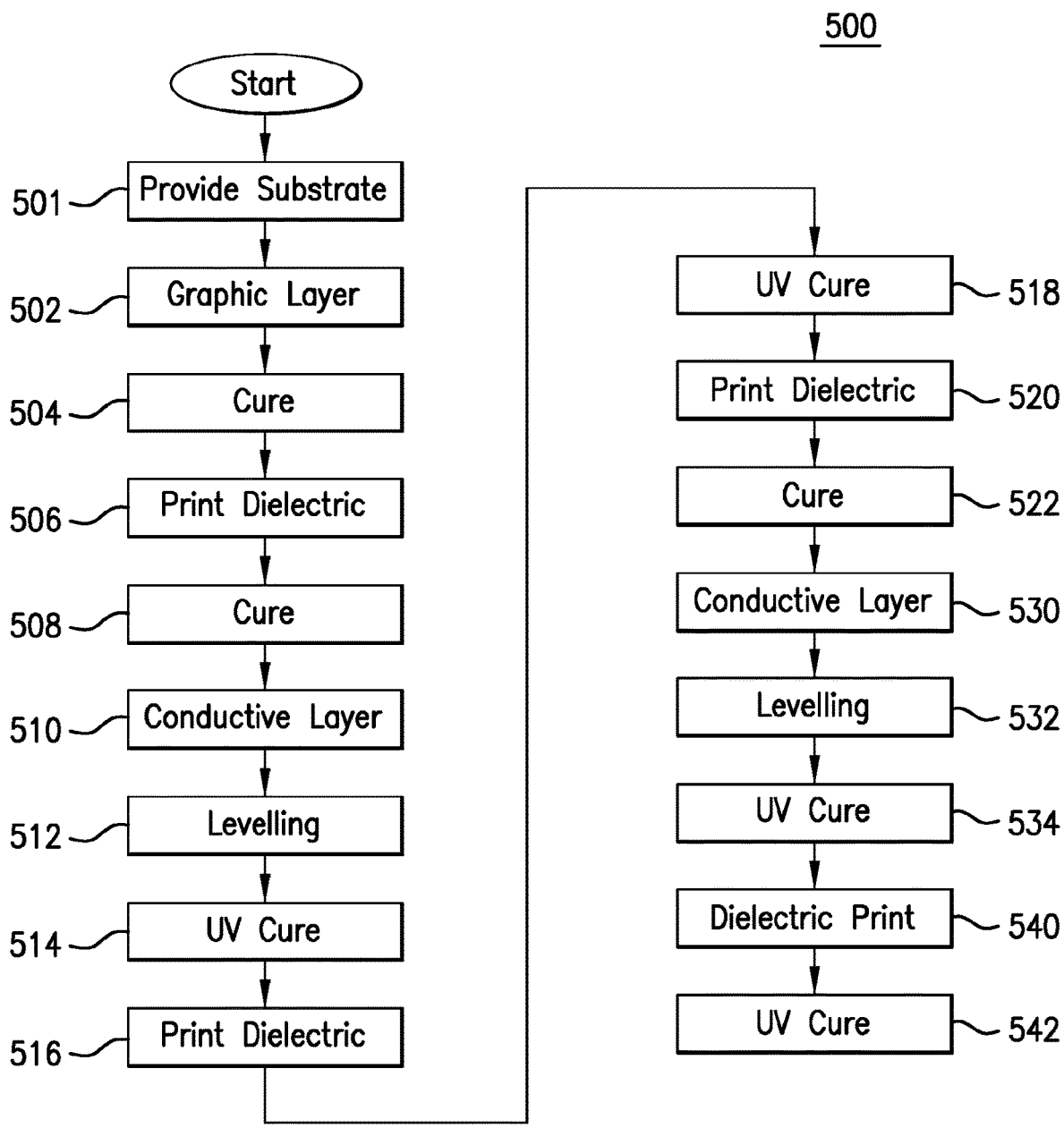
FIG. 5 is a flow diagram illustrating a method of multilayer printing.

FIG. 5 is a flow diagram illustrating a method 500 of forming an HMI according to embodiments. Of note, it will be appreciated that the numbers and types of layers discussed with respect to FIG. 5 are provided by way of example only. That is, the numbers and types of layers may vary for differing purposes without departing from the illustration of FIG. 5.

A substrate, such as a thermoform for use in a HMI, is provided at step 501. At step 502, a graphical layer formed of non-conductive, non-carbon inks is printed on the substrate. This layer is cured using any known methodology at step 504. At step 506, a dielectric layer is printed, and this layer is cured using any known methodology at step 508. At step 510, a conductive layer is printed. This layer is subjected to a low-durometer squeegee levelling at step 512, and is UV cured at step 514.

At steps 516 and 520, two dielectric layers are printed, and both are UV cured at steps 518 and 522. A conductive layer is printed at step 530, is levelled using a low durometer squeegee at step 532, and is UV cured at step 534. Finally, a dielectric layer is printed at step 540, and is UV cured at step 542.

In the foregoing Detailed Description, it can be seen that various features are grouped together in a single embodiment for the purpose of streamlining the disclosure. This method of disclosure is not to be interpreted as reflecting an intention that the embodiments require more features than are expressly recited herein. That is, the recited embodiments are provided by way of example only, and the disclosure encompasses any embodiments having more or fewer elements than the exemplary embodiments which will be apparent to the skilled artisan in light of the discussion herein.

What is claimed is:

1. A human machine interface, comprising:
    a thermoform substrate;
    a plurality of ultraviolet cured functional ink layers comprising at least a touch responsive circuit responsive to a human touch, a backlighting driver circuit suitable to light the touch responsive circuit, and a plurality of dielectric layers that impart functionality and protection to at least the touch responsive and backlighting driver circuit; and
    at least one graphical ink layer that associates graphics with the touch responsive circuit.

2. The human machine interface of claim 1, wherein at least ones of the ultraviolet cured functional ink layers further comprise squeegeed layers.

3. The human machine interface of claim 2, wherein the squeegee has a durometer of less than about 70.

4. The human machine interface of claim 1, wherein the at least one graphical ink layer comprises at least one ultraviolet cured graphical ink layer.

5. The human machine interface of claim 1, wherein the at least one graphical ink layer comprises two graphical ink layers.

6. The human machine interface of claim 1, wherein the at least one graphical ink layer comprises a non-carbon ink layer.

7. The human machine interface of claim 1, wherein the light for the touch responsive circuit comprises at least one light emitting diode.

8. The human machine interface of claim 1, wherein the touch responsive circuit comprises a capacitive touch responsive circuit.

9. The human machine interface of claim 1, further comprising a protective encapsulant printed over a last successive one of the plurality of ultraviolet cured functional ink layers.

10. The human machine interface of claim 1, wherein a thickness of a first successively printed one of the plurality of ultraviolet cured functional ink layers is in a range of 2 to 3 times a root mean square height value of a one of the at least one graphical ink layer upon which it is successively printed.

11. A method of forming an electronic human machine interface, comprising:
    successively printing at least two functional ink layers comprising at least one conductive layer and at least one dielectric layer on a substrate suitable for physical association with one of a thermoform and an overmold, ones of the at least two functional ink layers being responsive to a human touch to provide the electronic human machine interface;
    printing at least one non-conductive graphical ink layer in the succession of the successively printing;
    curing each of the successively printed layers after the printing of each of the successively printed layers, wherein the curing of the successively printed functional ink layers comprises at least an ultra-violet curing; and
    squeegeeing at least the at least one conductive layer with a squeegee having a durometer of less than about 70.

12. The method of claim 11, wherein the succession of successively printed functional ink layers comprises a conductive layer, followed by two dielectric layers, followed by another conductive layer, followed by a dielectric layer.

13. The method of claim 12, further comprising printing an encapsulation layer over a last of the successively printed layers.

14. The method of claim 13, wherein the last of the successively printed layers comprises a partial dielectric layer that covers only conductive traces of a conductive layer.

15. The method of claim 12, wherein the successively printed graphical ink layer is printed before any of the successively printed functional ink layers.

16. The method of claim 15, wherein the successively printed graphical ink layer comprises two successively printed graphical ink layers.

17. The method of claim 11, wherein a combination of the successively printed functional ink and graphical ink layers comprise seven layers.

18. The method of claim 11, wherein the graphical ink layer further comprises non-carbon.

19. The method of claim 11, wherein the squeegee has a durometer of about 60.

20. The method of claim 11, wherein the curing further comprises ultraviolet curing of the graphical ink layers.

* * * * *